(12) United States Patent
Aleiner et al.

(10) Patent No.: US 6,546,233 B1
(45) Date of Patent: Apr. 8, 2003

(54) LINEARIZATION OF POWER AMPLIFIER

(75) Inventors: Boris Aleiner, Somerset, NJ (US); Winston Hong Lieu, Holmdel, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 422 days.

(21) Appl. No.: 09/587,893

(22) Filed: Jun. 6, 2000

(51) Int. Cl.$^7$ .................................................. H04B 1/04
(52) U.S. Cl. ....................... 455/126; 455/67.1; 455/115
(58) Field of Search ................................ 455/115, 126, 455/67.1, 69, 85, 91, 11.1; 375/285

(56) References Cited

U.S. PATENT DOCUMENTS

| | | | |
|---|---|---|---|
| 5,809,083 A | * | 9/1998 | Wright .......................... 375/285 |
| 6,430,391 B1 | * | 8/2002 | Dent et al. ................... 455/11.1 |

FOREIGN PATENT DOCUMENTS

| | | |
|---|---|---|
| WO | PCT/US93/00226 | 1/1993 |

OTHER PUBLICATIONS

Kimura Koichi, Automatic Gain Control Circuit for Linearly Modulated Wave, Patent Abstract from Japan, Jan. 21, 1997.
Mohamed El–Torky & Dr. Kamilo Feher, The Effects of Transmitter Power Amplifier Nonlinearity on QPSK and Offset QPSK Radio Transmission Over Severely Bandlimited Channel, Canadien Communication and Power Conference of Montreal, 1978, pp. 153–156.

* cited by examiner

*Primary Examiner*—Thanh Cong Le
*Assistant Examiner*—Thuan T. Nguyen
(74) *Attorney, Agent, or Firm*—Manelli, Denison & Selter, PLLC (57) ABSTRACT

A apparatus linearizing and technique for linearizing a non-linear power amplifier used in a transmitter of, e.g., a TDMA mobile wireless telephone. Linearization of the non-linear amplifier by changing the shape of the input signal is performed when the input signal level is high, thus increasing efficiency or reducing power consumption at that time, albeit at the cost of increased inter-symbol interference (ISI). However, since the input signals at that time are at a high level, the increased ISI can be tolerated and adjacent symbols can still be distinguished from one another. The invention allows use of a non-linear power amplifier which typically enjoys a lower current consumption than that of a linear power amplifier, thus increasing the time between battery recharges and/or reducing the overall size of the wireless telephone device. The power amplifier is operated in a linear mode when transmitted power is low, thus allowing differentiation between adjacent symbols (i.e., improvement of ISI). At high input power, the power amplifier is used in its non-linear mode to reduce current consumption. The signal shape is changed by changing the parameters of the root raised cosine filters. When the input level is low, the existing, otherwise conventional filter's parameters are used. However, when the input power level is high, modified parameters are used. Switching between the two sets of filter parameters is preferably performed at baseband. Thus, a relationship between RRCF filter parameters and the amount of spectrum utilized by the transmitted signal is utilized, and RRCF filter parameters are adjusted based on a desired limitation to an output spectrum.

17 Claims, 15 Drawing Sheets

Raised Cosine Frequency Response for Various Values of β

2b NLinear RRCF

-- MODULATION ANALYSIS (NADC) --    Measure : SINGLE    MOD.ANAL

FREQUENCY
  Carrier frequency : 1 889.999 990 1 MHz
  Carrier frequency error : -0.009 9 kHz MODULATION
  RMS vector error : 6.12 % (rms)
  First 10 symbols RMS vector error : 5.34 % (rms)
  Peak vector error : 16.94 %
  Magnitude error : 5.10 % (rms)
  Phase error : 1.92 deg. (rms)
  Origin offset : -41.49 dB
  Droop factor : 0.004 8 dB/symbol DATA (10 burst average "ON" only)

F = 1.89 G
$V_{dd}$ = 6 v    I = 0.55 A
$V_{qq}$ = -5.1 v    PIN = 5.9 dBm
    RRCF

```
┌─── PARAMETERS ───┐
│ Frequency :      │
│     1 890.000 000 MHz │
│ RF level :   30 dBm │
└──────────────────┘
```

FIG. 7C

2c NLinear RRCF

-- ADJACENT CHANNEL POWER (NADC) --    Method : HIGH SPEED
                                       Storage : AVG = 20

Mean power due to modulation
    −90 kHz    :    −64.35 dB
    −60 kHz    :    −47.88 dB
    −30 kHz    :    −25.85 dB
     30 kHz    :    −26.91 dB
     60 kHz    :    −46.44 dB
     90 kHz    :    −62.78 dB Peak power from switching transients
    −90 kHz    :    −55.90 dB
    −60 kHz    :    −39.22 dB
    −30 kHz    :    −20.38 dB
     30 kHz    :    −21.66 dB
     60 kHz    :    −39.03 dB
     90 kHz    :    −52.50 dB

```
┌──── PARAMETERS ────┐
│Frequency :         │
│       1 890.000 000 MHz│
│RF level  :    30 dBm│
└────────────────────┘
``` f = 1.89 GHz
$V_{dd}$ = 6 v      I = 0.55 A
$V_{qq}$ = −5.1 v
    RRC filter
    PIN = 5.9 dBm

-- MODULATION ANALYSIS (NADC) --          Measure : SINGLE

FREQUENCY
   Carrier frequency                        :    1 889.999 989 9 MHz
   Carrier frequency error             :           -0.010 1 kHz MODULATION
   RMS vector error                    :          14.29 % (rms)
   First 10 symbols RMS vector error  :          9.01 % (rms)
   Peak vector error                   :          26.86 %
   Magnitude error                     :          11.69 % (rms)
   Phase error                           :           4.76 deg. (rms)
   Origin offset                         :         -37.91 dB
   Droop factor                         :          0.003 4 dB/symbol DATA (10 burst average "ON" only)

f = 1.89 G
       Vdd = 6 v
       Vqq = -5.1 v
           NYQ filter
           PIN = 6.3 dBm

```
------- PARAMETERS -------
Frequency :
              1 890.000 000 MHz
RF level  :       30 dBm
```

FIG. 8C

-- ADJACENT CHANNEL POWER (NADC) --        Method : HIGH SPEED1
                                           Storage : AVG = 20

Mean power due to modulation
    −90 kHz  :  −67.57 dB
    −60 kHz  :  −53.35 dB
    −30 kHz  :  −27.24 dB
     30 kHz  :  −27.95 dB
     60 kHz  :  −52.15 dB
     90 kHz  :  −67.43 dB Peak power from switching transients
    −90 kHz  :  −59.19 dB
    −60 kHz  :  −46.58 dB
    −30 kHz  :  −21.08 dB
     30 kHz  :  −20.31 dB
     60 kHz  :  −46.08 dB
     90 kHz  :  −59.86 dB f = 1.89 GHz
Vdd = 6 v    I = 0.54 A
Vqq = −5.1 v
NYQ filter
PIN = 6.3 dBm ----- PARAMETERS -----
Frequency :
    1 890.000 000 MHz
RF level  :    30 dBm

LINEARIZATION OF POWER AMPLIFIER

BACKGROUND OF THE INVENTION

1. Field of the Invention

This invention relates generally to wireless telephones. More particularly, it relates to a linearization technique allowing use of a non-linear power amplifier in a time division multiple access (TDMA) wireless telephone.

2. Background of Related Art

Mobile wireless telephones have become commonplace in today's society. Wireless telephones enable a user to participate in a telephone call virtually wherever they go.

Initially, wireless telephones communicated with a base station using analog transmission techniques. However, more recently digital techniques such as time division multiple access (TDMA) have been implemented in wireless telephones. TDMA generally refers in the wireless telephone world as a technology for delivering digital wireless service using time division multiplexing (TDM). TDMA works by dividing a radio frequency into time slots, and then allocating time slots to mobile telephones as the needs arise. In this way, a single frequency can support multiple, simultaneous data channels.

Figure 1:
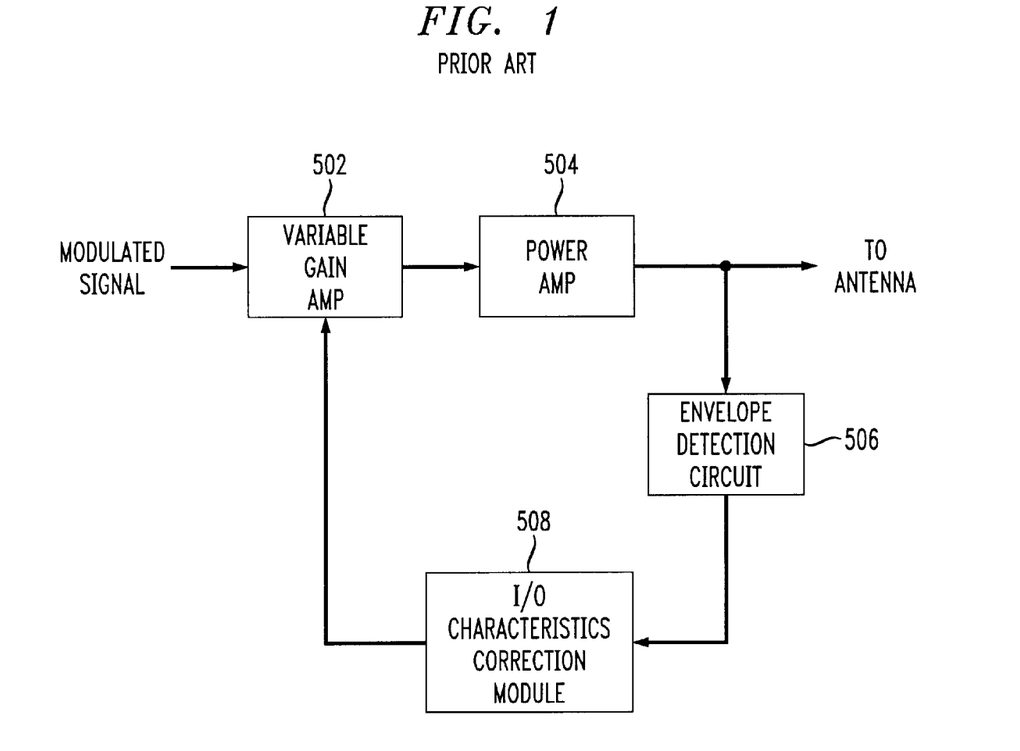
FIG. 1 is a block diagram of the relevant portion of a conventional TDMA wireless telephone.

FIG. 1 is a block diagram of the relevant portion of a conventional TDMA wireless telephone.

In particular, in FIG. 1, a modulated signal is input to a variable gain amplifier 502, and then to a power amplifier 504 for transmission. A portion of the signal output from the power amplifier 504 is detected by an envelope detection circuit 506, and the detected signal is output to a correction circuit 508. The correction circuit 508 corrects the input/output (I/O) characteristics of the variable gain amplifier 502 based upon characteristics in the non-linear area of a detecting diodes to characteristics approximate to linear characteristics by the use of characteristics reversed to the characteristics of the non-linear area of the power amplifier 504.

Generally, the power amplifier 504 provides the energy necessary to transmit a wireless signal to a receiving base station some distance away. In a wireless device, the power amplifier 504 is a major contributor (and usually the most significant contributor) to the drain of the battery of the device. Increased efficiency in the power amplifier 504 leads directly to increased talk time, to increased standby time, and/or to reduced weight (i.e., smaller battery) and/or to decreased size of the wireless device.

While advantages can be gained by reduced linearity of the power amplifier 504, there are limitations. For instance, current industry standards specify the maximum distortion level of the transmitted output signal. Conventionally, a linear power amplifier is used to insure that the output signal is clear and undistorted. The higher the level of the power amplifier's linearity, the lower the distortion level of the transmitted signal. However, linearity and efficiency are inversely related to one another. Thus, a high efficiency power amplifier usually is a non-linear power amplifier.

Clearly, it is beneficial to reconcile the balanced relationship between the requirements for linearity and efficiency.

One technique for improving the linearity of a power amplifier without sacrificing efficiency is by introducing linearization circuits to a non-linear amplifier. The assumption behind this idea is that linearizators consume much less DC power than linear power amplifiers. One conventional implementation of linearization circuits is the use of a "feed forward" linearization technique. A feed forward lineariza- tion technique is shown in, e.g., Japanese Patent Application number 01713661 to OKI Electric Ind. Co. Ltd, published Jan. 21, 1997.

Unfortunately, conventional linearization methods require additional circuitry, which increases the cost and reliability of a wireless transmitter. Moreover, such conventional linearization techniques have typically not been comprehensively tested for applications to Class C amplifiers.

Thus, there is a need for a simple and inexpensive technique and apparatus for improving the efficiency of a wireless device transmitter, particularly in a TDMA transmitter, without sacrificing linearity of the power amplifier in doing so.

SUMMARY OF THE INVENTION

In accordance with the principles of the present invention, a transmitter of a wireless device comprises a power amplifier, and a root raised cosine filter. A first set of parameters for the root raised cosine filter adapt the root raised cosine filter to provide a first level of linearization to a modulated signal amplified by the power amplifier. A second set of parameters for the root raised cosine filter adapt the root raised cosine filter to provide a second level of linearization to the modulated signal amplified by the power amplifier.

A method of improving efficiency of a power amplifier in a transmitter in accordance with another aspect of the present invention comprises adaptively configuring a first set of parameters in a root raised cosine filter when a transmit power of the power amplifier is below a predetermined level, and adaptively configuring a second set of parameters in the root raised cosine filter when a transmit power of the power amplifier is above the predetermined level.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a method and apparatus for linearizing a power amplifier intended for use in mobile telephones utilizing multiple access techniques, e.g., TDMA, CDMA, FDMA, etc.

The problem created by the distorted output signal is in spreading of its spectrum. The adjacent and alternative channels are especially vulnerable to it, since the result of the unwanted spectrum spread could not be filtered out for them. From the fundamental theory it follows that the spectrum spread to the adjacent and alternative channels happens only if the input signal is an amplitude-modulated one. For instance, according to the TDMA standard (IS-136), the input signal is indeed amplitude-modulated. The amplitude-modulation is done by the special Nyquist-type shaping of the input signal. The shaping is required to avoid Inter-Symbol Interference (ISI).

The measure of ISI for the transmitter is Error Vector Magnitude (EVM). The measure of linearity is Adjacent Channel Power (ACP). The TDMA standard requires the value of ACP to be at least 26 dB. Usually for a linear amplifier (that is, for an amplifier with ACP$\geq$29 dB) the value of EVM is ~4%. For a nonlinear amplifier (that is, for an amplifier with ACP$\leq$26 dB) the value of EVM is ~6%. The TDMA standard requires the value of EVM to be 12.5%. It means that there is a room for the increase of the value of EVM if this measure will improve linearity (that is, increase the value of ACP).

As it follows from the previous discussion, the factor determining the spectrum spread is a shaping of input signals. The shaping is done in baseband by Root Raised Cosine filters (RRCF). Changing the RRCF parameters leads to the change of a pulse shaping. This change, in turn, leads to the improvement of ACP, but degradation of ISI.

Square-root raised cosine filters (RRCFs) are included in every approved wireless modulation standard. Raised cosine filters (including RRCFs) are popular in wireless communications since they produce a strictly bandlimited signal. This is desirable since it reduces the interference the modulated signal creates for use in adjacent channel bands. It allows a communication system to signal at a rate near the Nyquist rate for the channel bandwidth without the excessive sidelobe filtering which can cause channel distortion and intersymbol interference (ISI).

A square-root or root raised cosine filter is used in most communications applications. The RC pulse shape is divided into two parts, one for the transmitter and one for the receiver. In this case, each side has what is called a root raised cosine filter forming a matched filter pair.

The RC pulse shape may be implemented either at baseband (on the data) or at RF (at the output of a modulator). Most practical applications follow the baseband approach using, e.g., a digital signal processor (DSP) which essentially stores sampled values of the pulse shape in a look-up table. These values are typically read out at the sample clock frequency to produce a symbol for modulation and transmission.

In a RRCF, the goal is to find a compromise between ISI and ACP requirements by adjusting RRCF parameters. This adjustment should be flexible, though. The RRCF parameters should return to the original values when the output signal is not spread more that the spec allows.

Disclosed embodiments include an additional set of RRCF filter parameters for use with one or more RRCFs, providing a selection between either one the two sets of RRCF filter parameters at any one time. The RRCF filter parameters are selected based on an operating mode of the wireless device. In particular, in the disclosed embodiments, one set of RRCF parameters is automatically selected and implemented when the wireless device is transmitting at high (e.g., maximum) power, and the other set of RRCF parameters is automatically selected and implemented when the wireless device is transmitting lower than at high power.

Thus, the shaping of a modulated signal output at high transmit levels is changed in accordance with the level of the transmit power. This typically increases inter-symbol interference (ISI), although not significantly, especially for high power level output signals, but does improve the ACP (i.e., it reduces the spectrum spread, in essence improving linearity of the transmit power amplifier).

Using the automatic selection of RRCF parameters, an inexpensive and easily implemented power amplifier having adaptable linearization can be implemented in a multiple access system, e.g., TDMA, FDMA, CDMA, etc. In fact, the efficiency of the transmitter can be improved significantly (e.g., by as much as 10% to 20% or more) without the need to operate the power amplifier in a greater non-linear region.

Because efficiency and/or linearity can be significantly improved without the need to detrimentally affect the other, non-linear amplifiers which draw smaller amounts of current may be used. This increases the time between battery recharges, and further reduces the overall size of the device.

Figure 2:
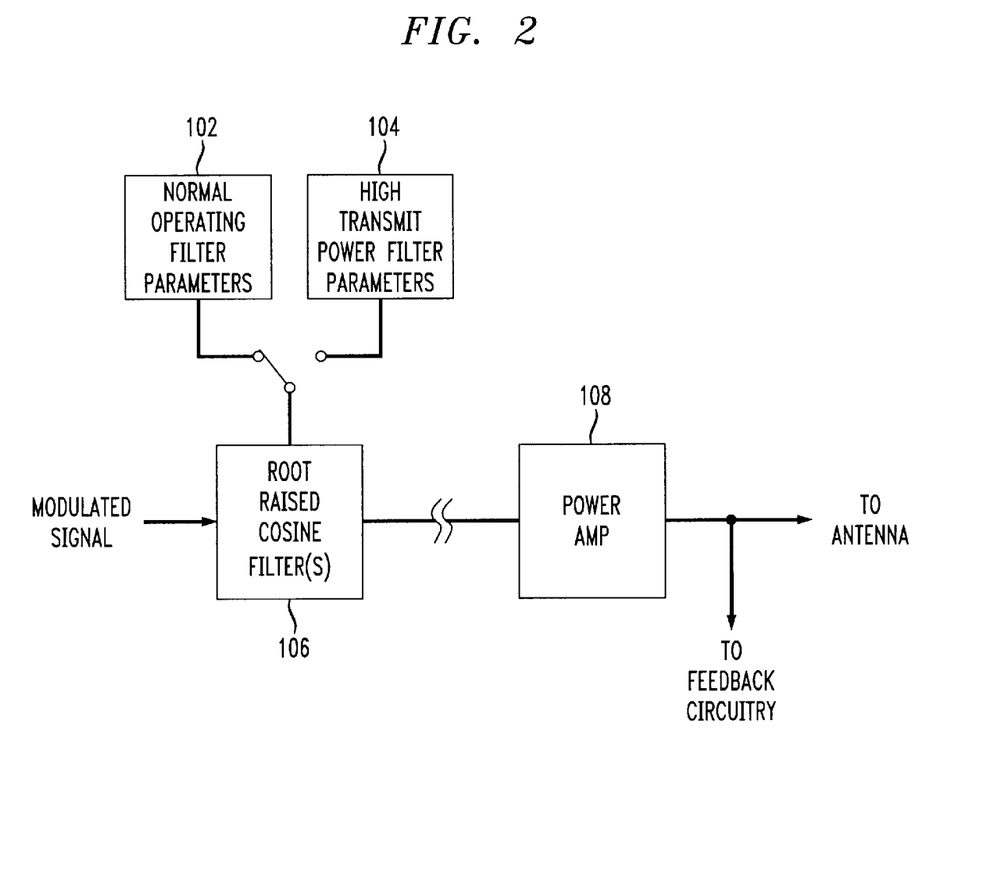
FIG. 2 shows the relevant transmitter portion of a wireless device (e.g., a TDMA wireless telephone) including an adaptable root raised cosine filter (RRCF) having access to at least two different operating filter parameters, in accordance with the principles of the present invention.
Figure 3A:
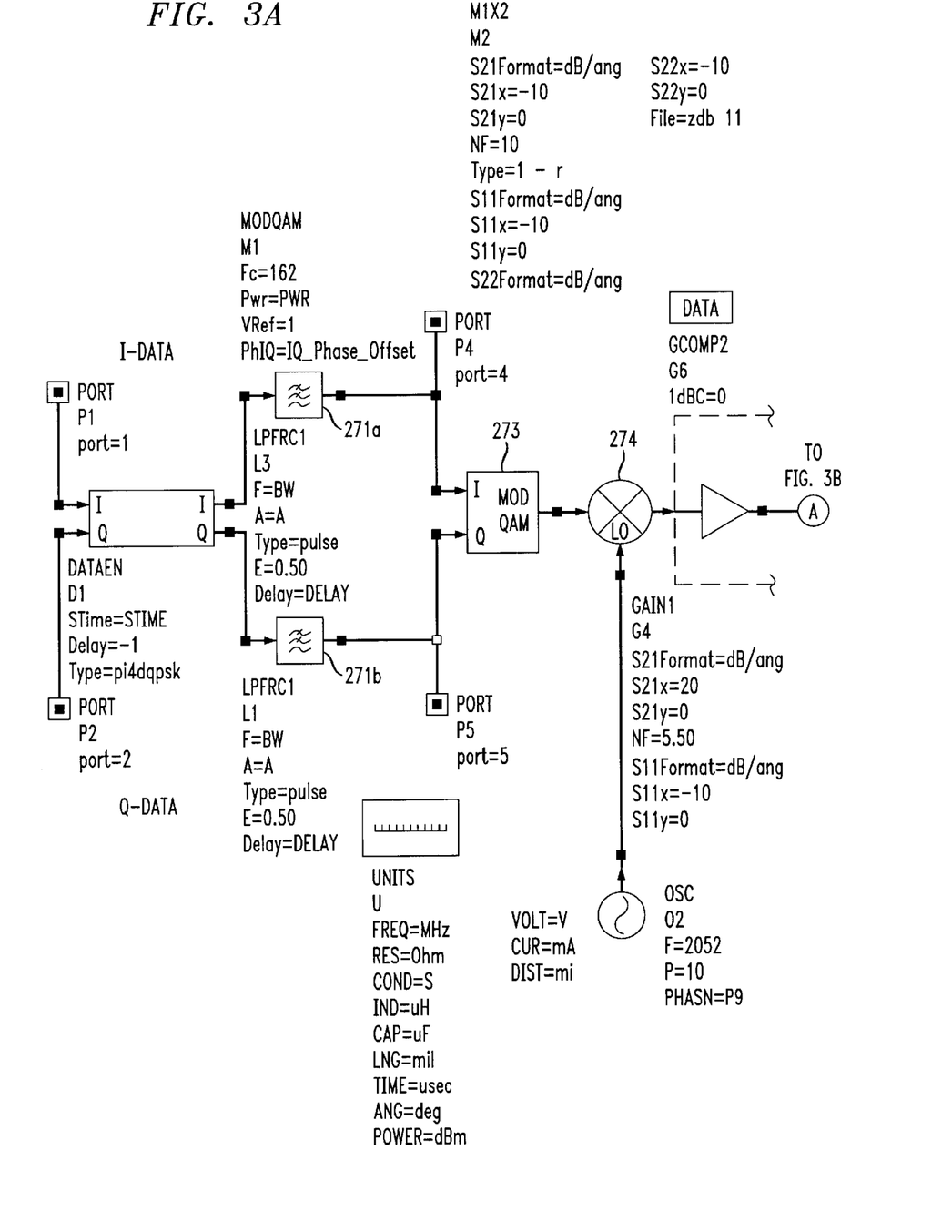
FIGS. 3A to 3D show a more detailed block diagram used to obtain simulated results.
Figure 3B:
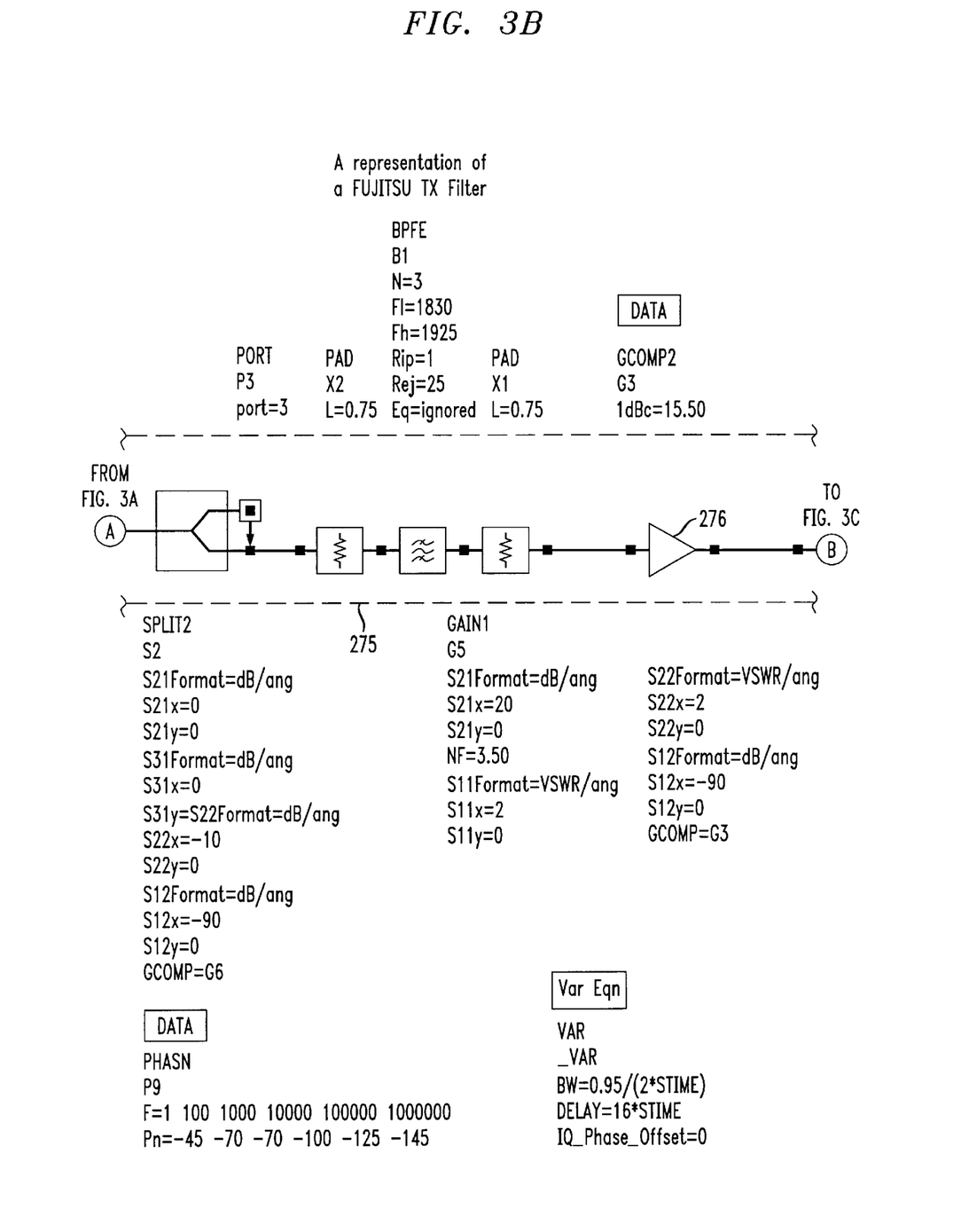
Figure 3C:
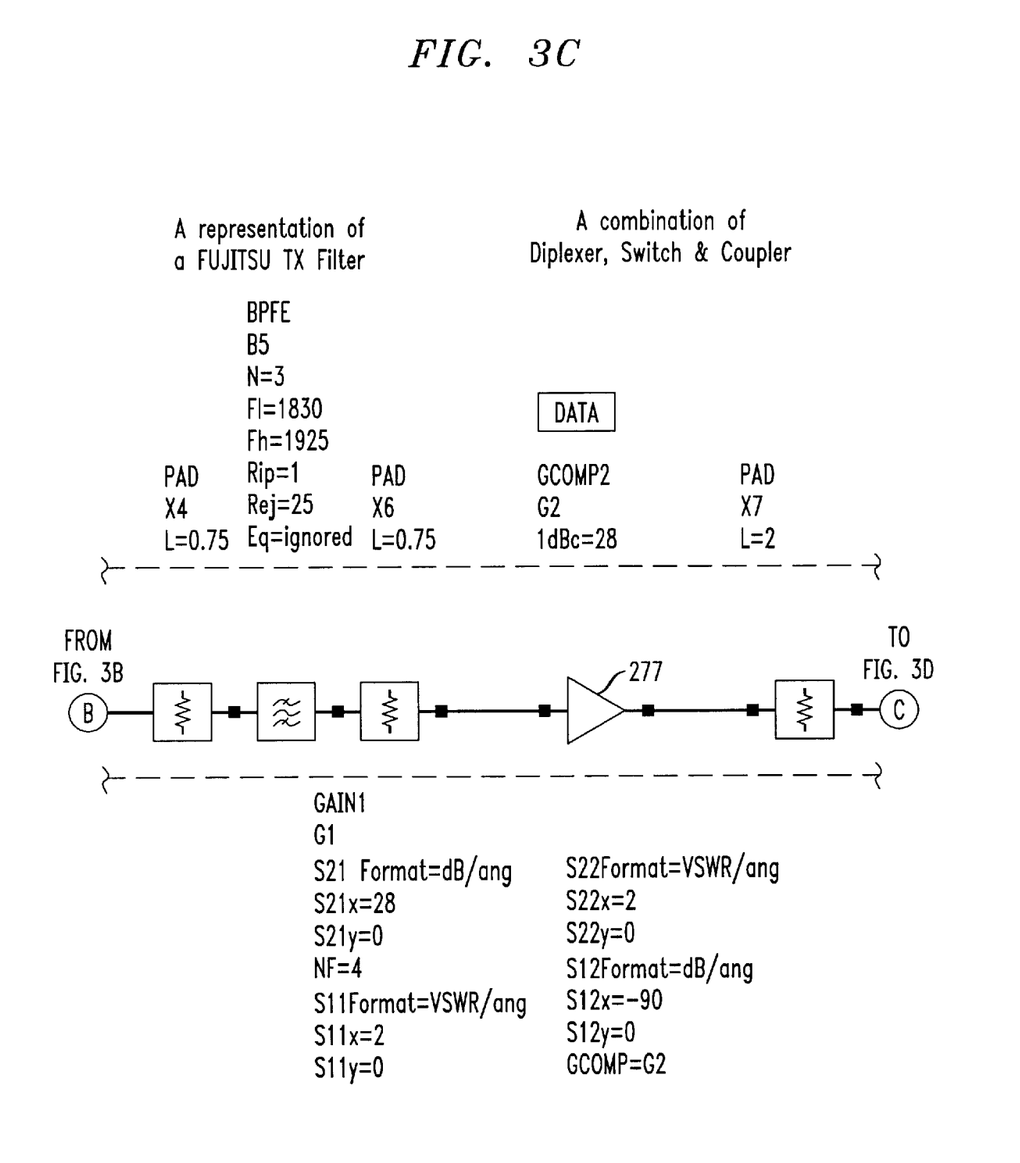
Figure 3D:
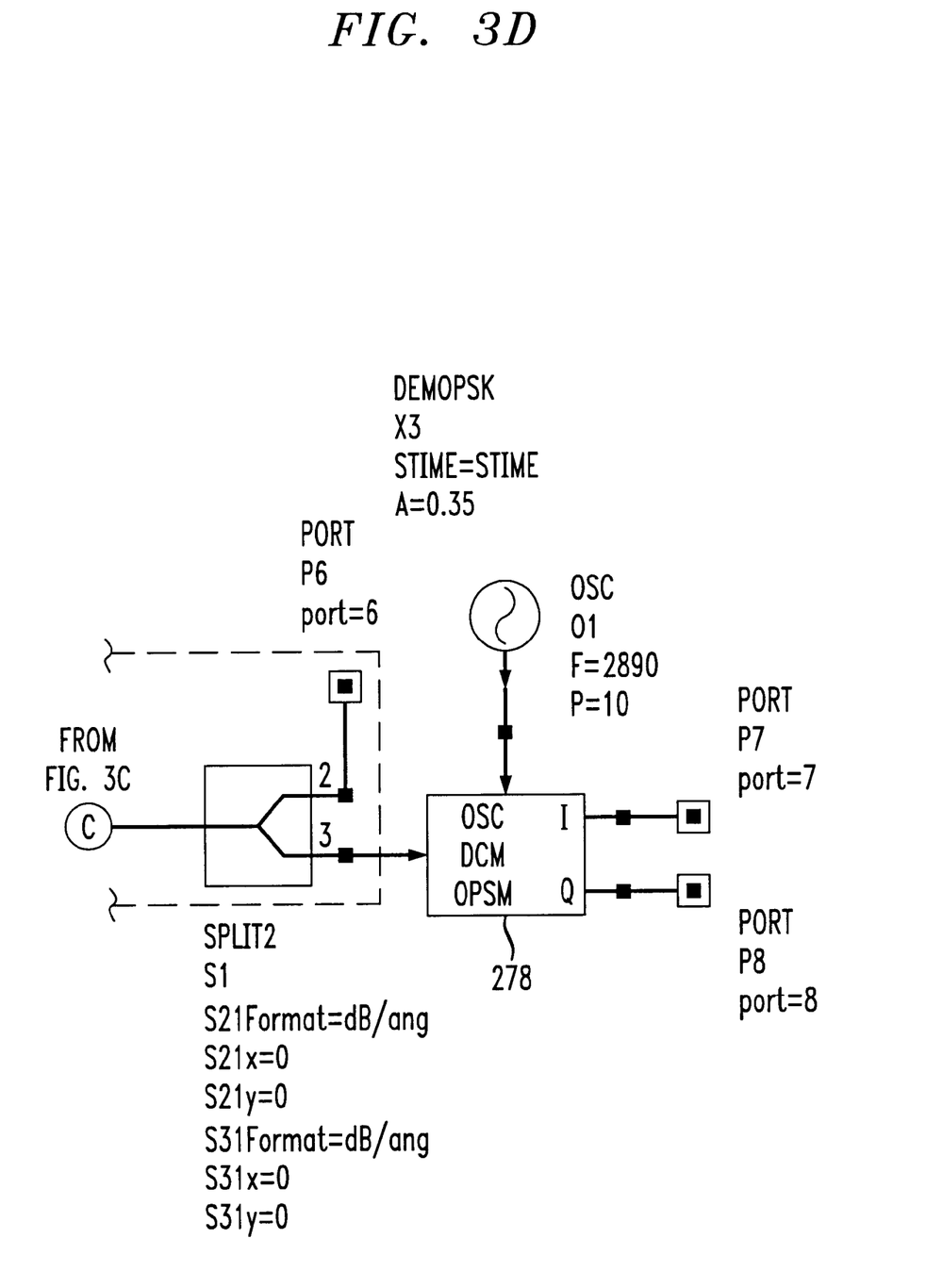

FIG. 2 shows the relevant transmitter portion of a wireless device (e.g., a TDMA, CDMA or FDMA wireless telephone) including an adaptable root raised cosine filter (RRCF) having access to at least two different operating filter parameters.

In particular, as shown in FIG. 2, a root raised cosine filter 106 is adaptably configured with either normal operating filter parameters 102, or with high transmit power filter parameters 104. The root raised cosine filter provides linearization to the modulated signal, to effectively linearize the output power amplifier 108, creating a more power efficient transmitter with little increased circuitry and little increased power draw.

FIGS. 3A to 3D show a more detailed block diagram used to obtain simulated results.

In particular, in FIGS. 3A to 3D, a transmitter includes a data encoder 272 receiving Q and I data streams.

A pair of root raised cosine filters 271$a$, 271$b$ filter the Q and I data streams, respectively. The RRCF filters 271$a$, 271$b$ are located in the baseband.

The RRCF filtered input Q and I data streams (i.e., the digital baseband data streams) are modulated by an appropriate modulator, e.g., a quadrature amplitude modulator (QAM) 273, to output an appropriate RF signal.

An upconverter 274 upconverts the modulated signal to the appropriate RF frequency for use by the transmitter.

The RF transmitter portion 275 includes a two stage power amplifier comprising a $1^{st}$ stage preamplifier 276 and a second stage power amplifier 277.

The power amplifier is linearized by changing the shape of the input signal to reduce a spectrum spread associated with non-linear effects in accordance with the principles of the present invention. The change of the input signal shape is achieved by changing parameters of the RRCF 271$a$, 271$b$. Accordingly, the power amplifier operates in nonlinear mode when transmitted power is high, thus allowing improved efficiency.

The RRCF utilizes a first set of parameters when the power amplifier is in a high power mode. The increased ISI due to the non-linearity is not detrimental since it is easier to differentiate between adjacent symbols at high power.

When operating in a low power mode (e.g., when not at maximum power), a second set of parameters of the RRCF is downloaded. This will reduce the overall intersymbol interference (ISI).

Figure 4:
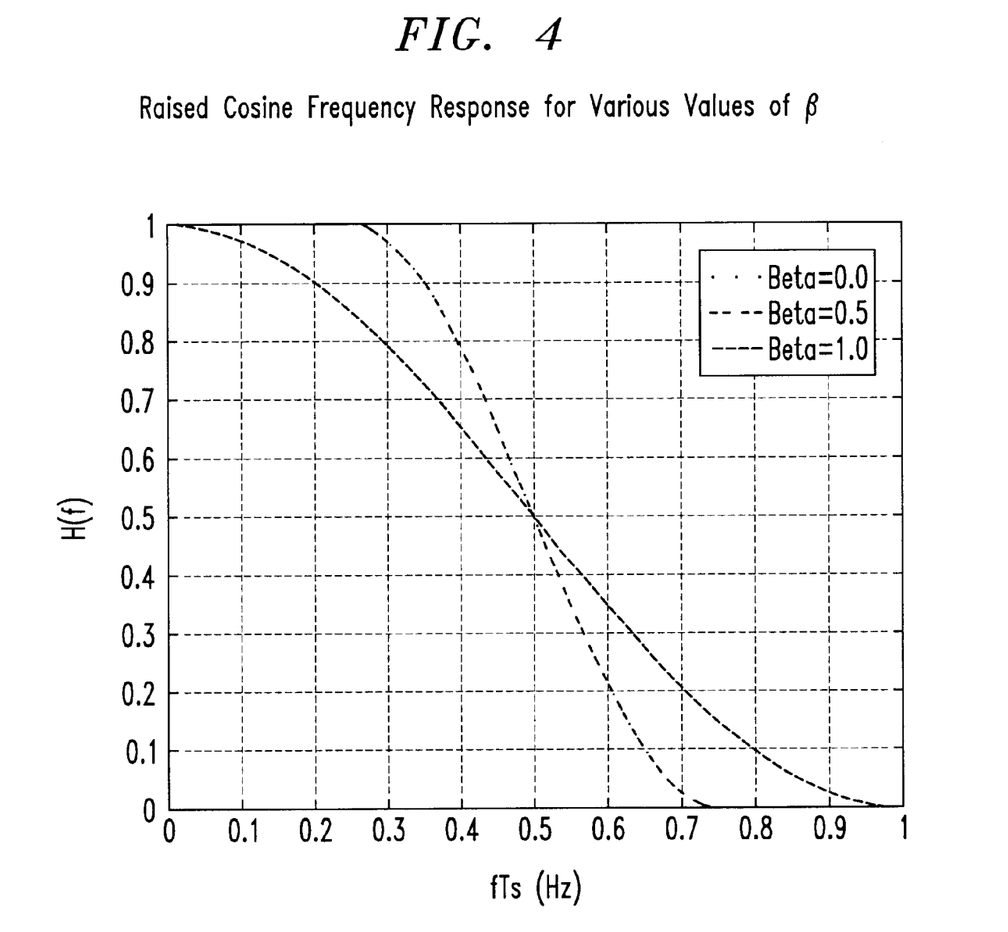
FIG. 4 shows a raised cosine frequency response for various values of β.

FIG. 4 shows a raised cosine frequency response for various values of β.

Figure 5:
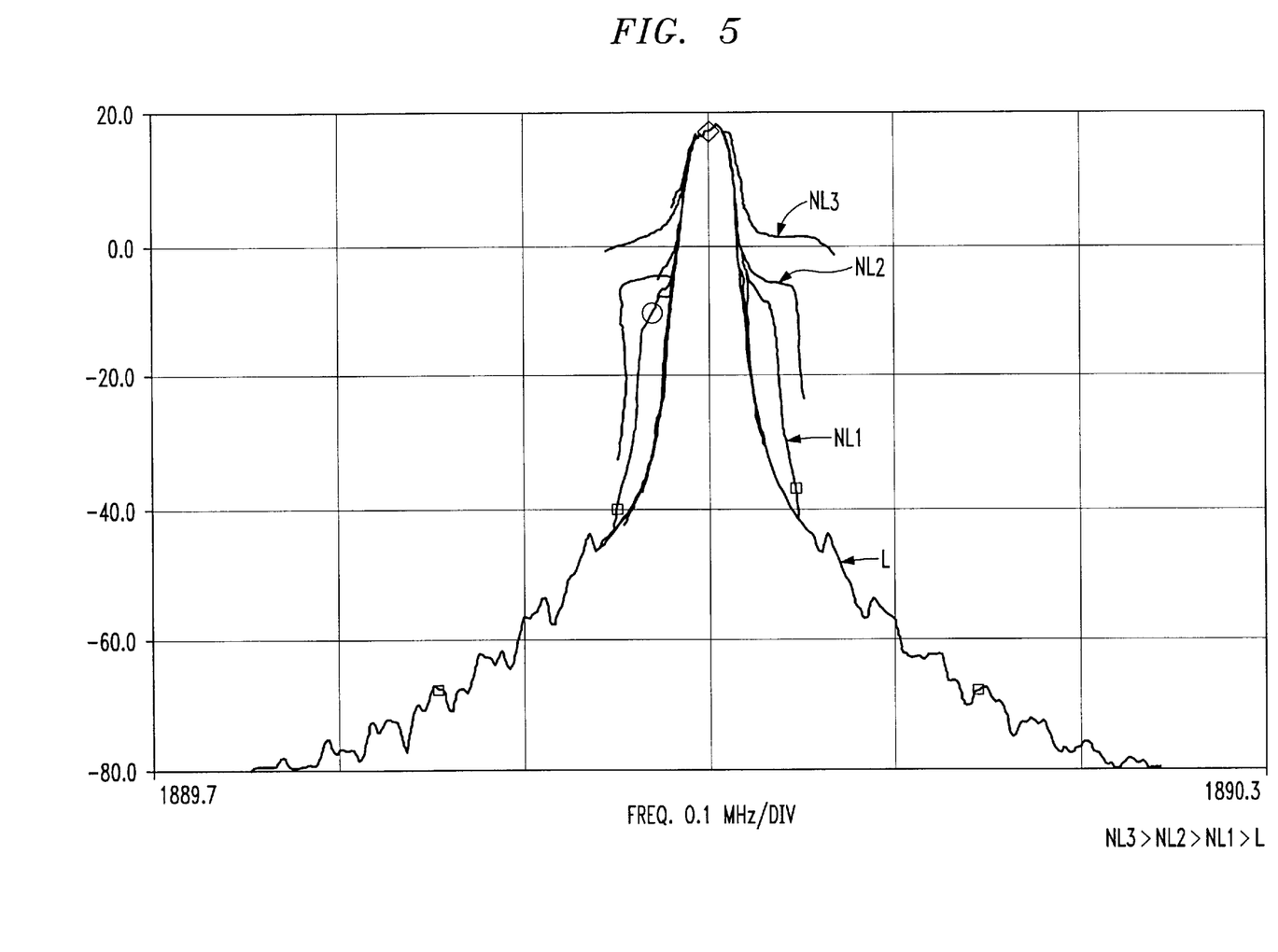
FIG. 5 shows spectral plots of an ideal linear amplifier (as a result of simulations), as well as three gradations of worsening non-linearity in a power amplifier.

FIG. 5 shows spectral plots of an ideal linear amplifier, as well as three gradations of worsening non-linearity in a power amplifier.

In particular, as shown in FIG. 5, a linear power amplifier utilizes a narrow spectrum L, while a somewhat non-linear power amplifier utilizes a wider spectrum NL1, with respect to a measurement, e.g., above −40 dB as shown in FIG. 5.

Expanding upon this thought, a more non-linear power amplifier utilizes a wider yet spectrum NL2, and a very non-linear power amplifier utilizes a very wide spectrum NL3.

The principles of the present invention make note of the relationship between RRCF filter parameters, and the amount of spectrum utilized by the transmitted signal, and adjusts RRCF filter parameters based on a desired limitation to an output spectrum.

The implementation of a root raised cosine filter (RRCF) includes determination of specific parameters for the RRCF while the output of the non-linear power amplifier is at a high level (e.g., at a maximum level), and a reliance upon original, otherwise conventional parameters when the output spectrum spread of the non-linear power amplifier is within allowable limits, e.g., below the high level (e.g., maximum level).

Figure 7A:
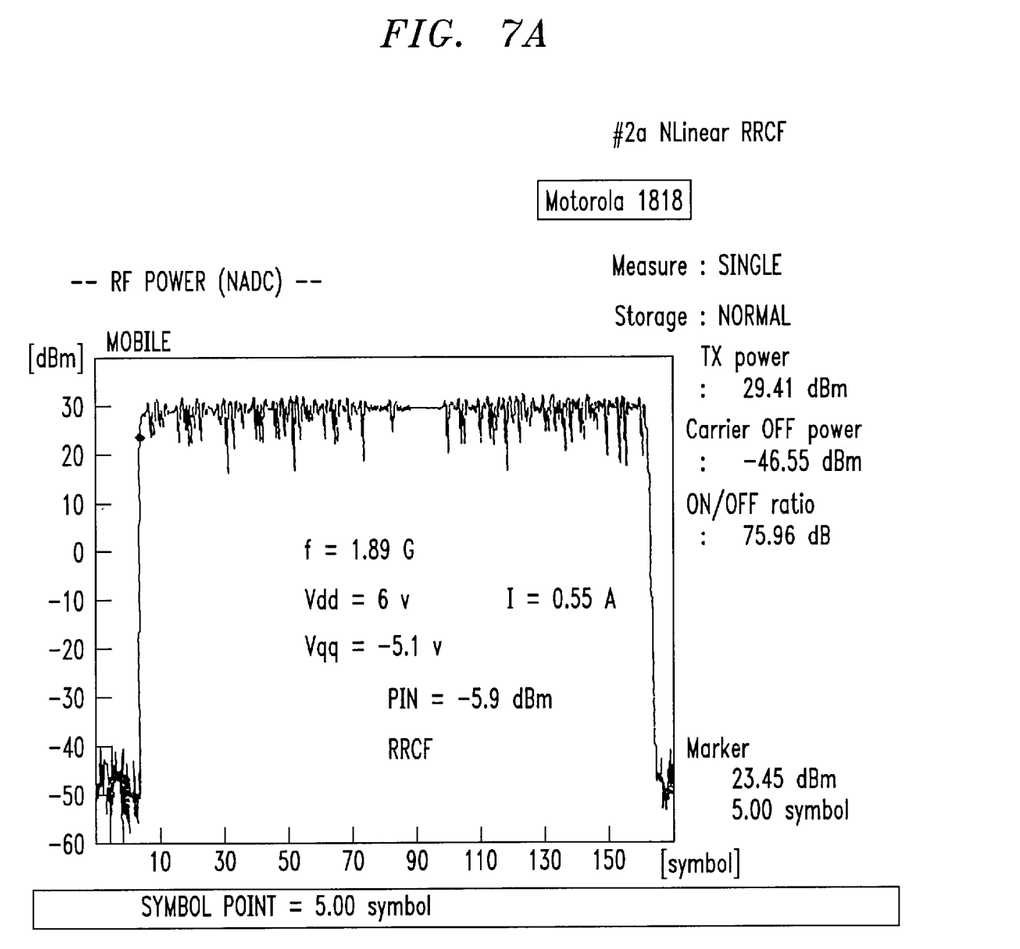
FIGS. 7A to 7C show experimental results of a transmitter including a non-linear amplifier and an RRCF using normal parameters, in accordance with the principles of the present invention.
Figure 7B:
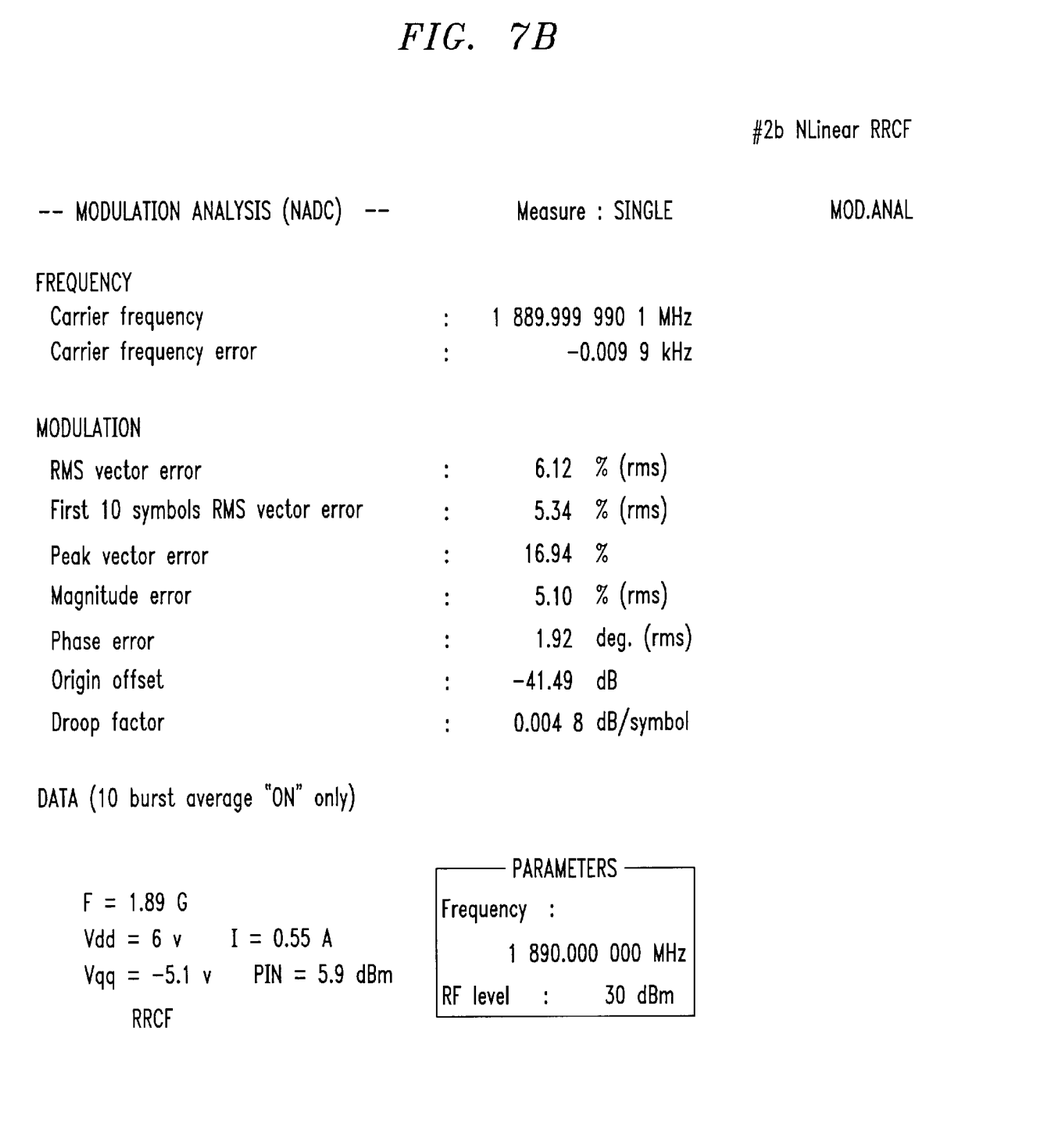
Figure 7C:
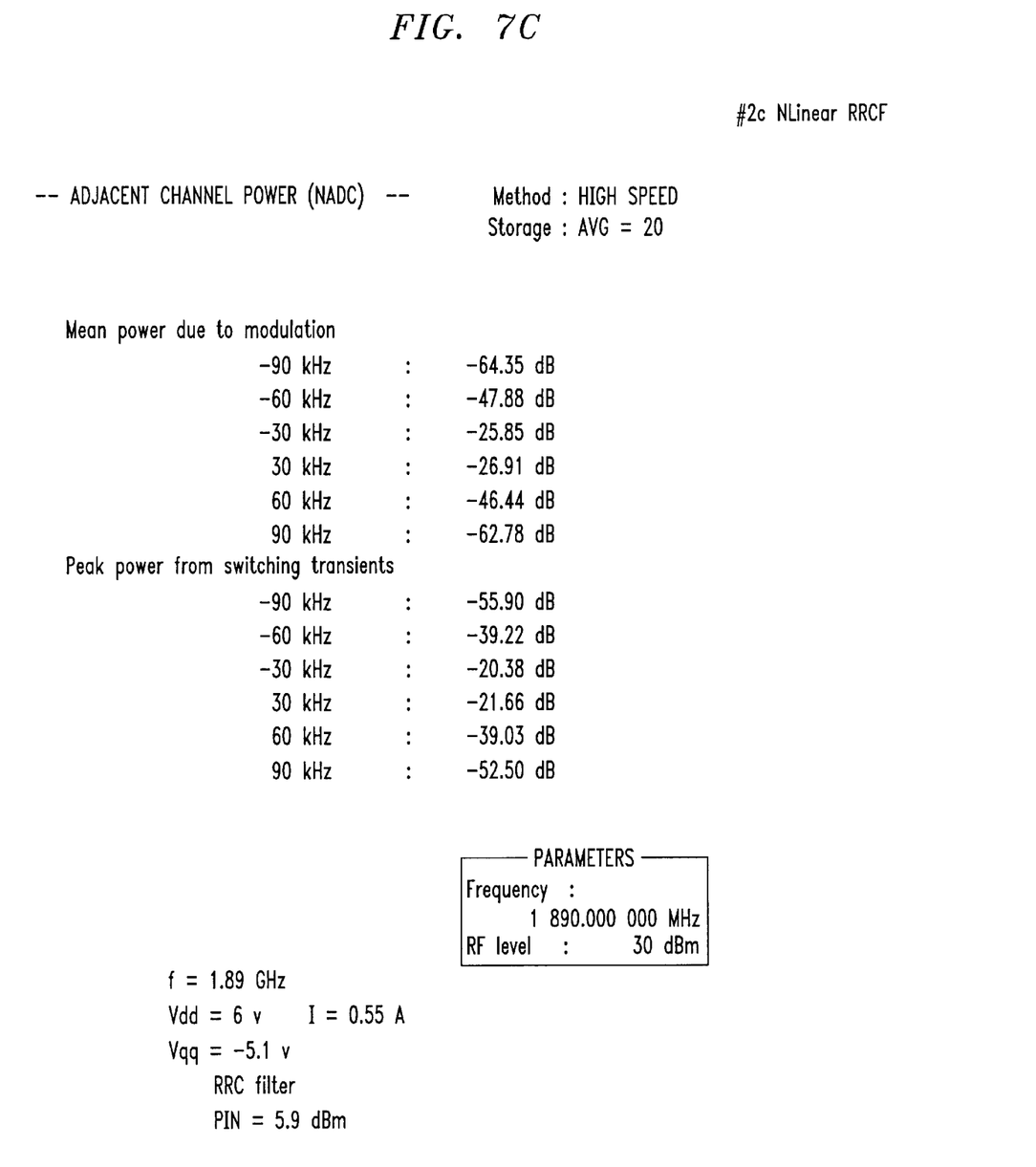

FIG. 7A is the transmit power level of 29.41 dBm. Of note in FIG. 7B is the RMS vector error of 6.12% (rms), showing percentage of modulation, and of note in FIG. 7C is the mean power due to modulation at −30 kHz of −25.85 dB (which is beyond the desired specification of −26 dB). This indicates that the spectrum spread is more than the specified value of allowed adjacent channel power.

However, in accordance with the principles of the present invention, the parameters of the RRCF filter can be changed to high transmit power filter parameters 104 to bring the resulting adjacent channel power into specification. This is demonstrated in the results shown in FIGS. 8A to 8C.

Figure 8A:
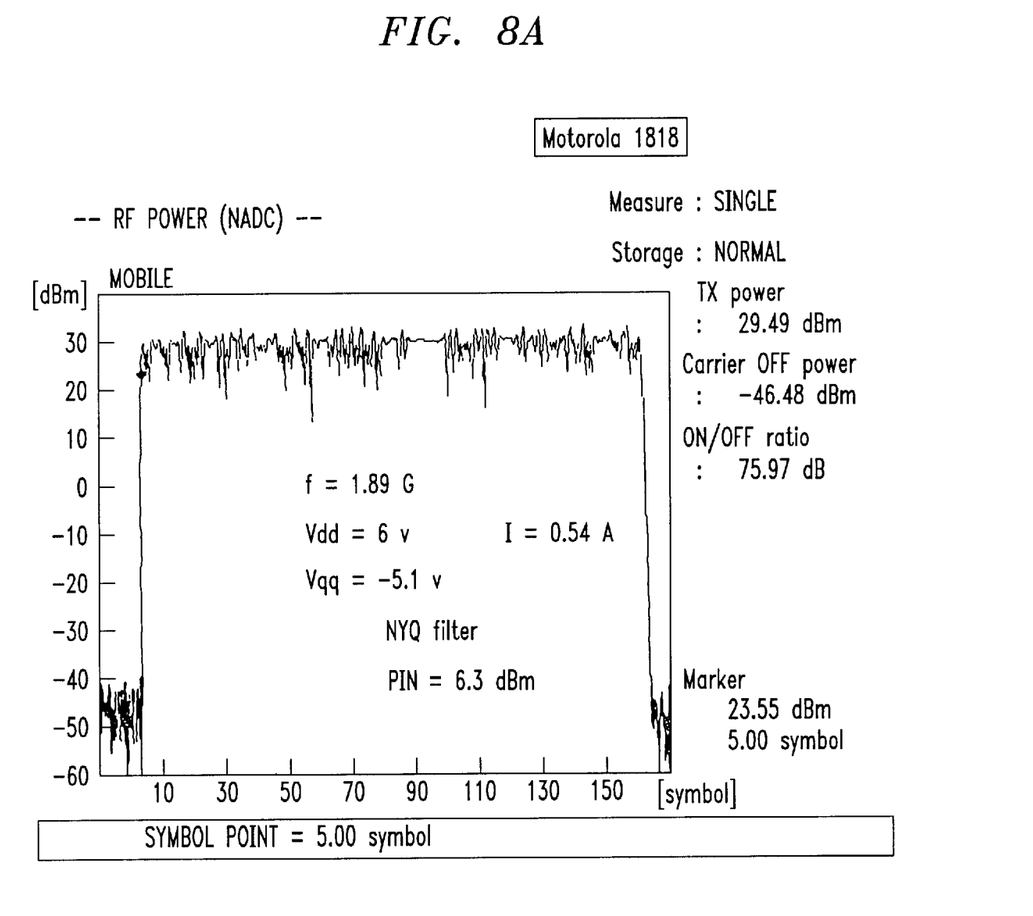
FIGS. 8A to 8C show experimental results of a transmitter including a non-linear amplifier and a Nyquist filter simulating an RRCF with high output power parameters, in accordance with the principles of the present invention.
Figure 8B:
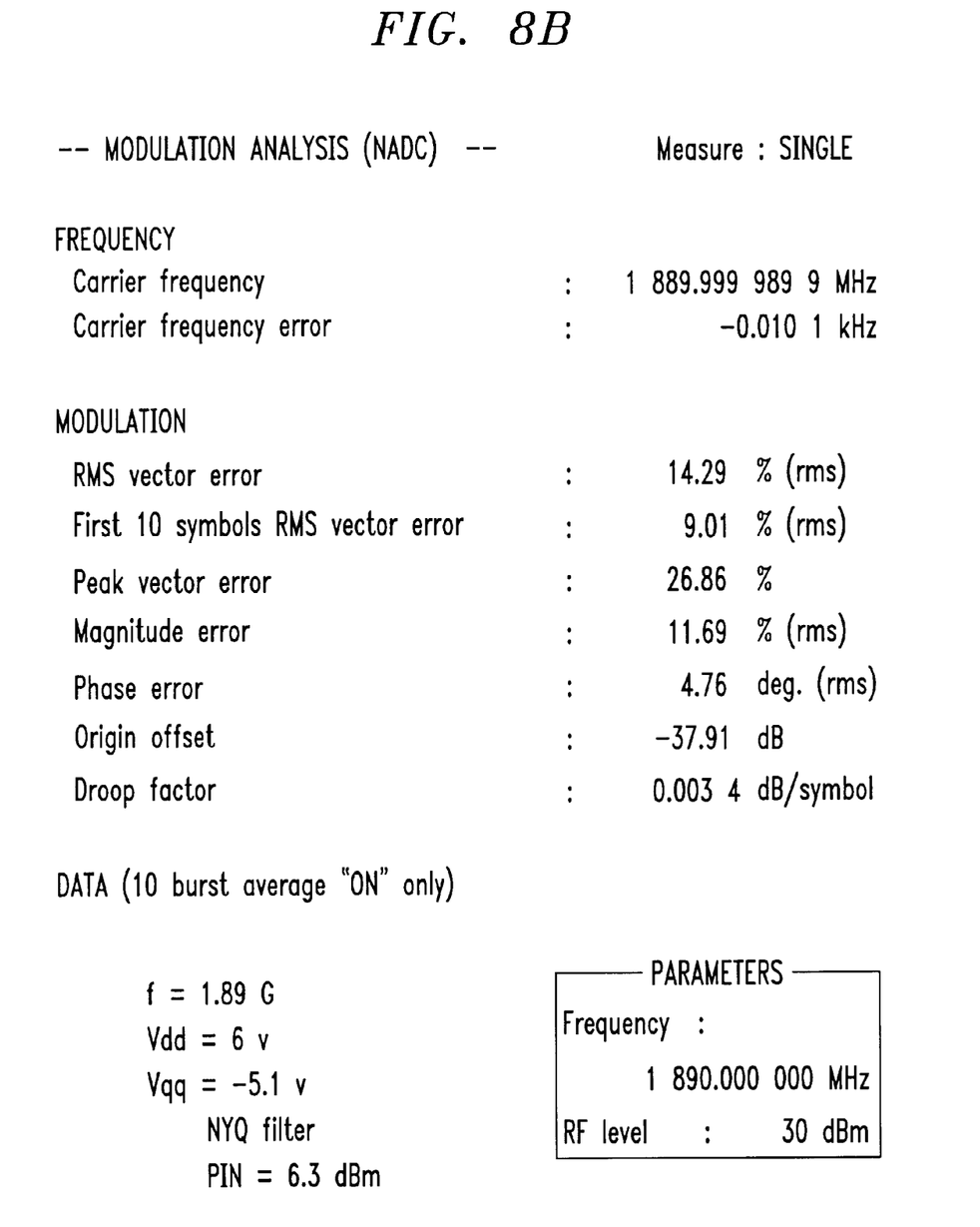
Figure 8C:
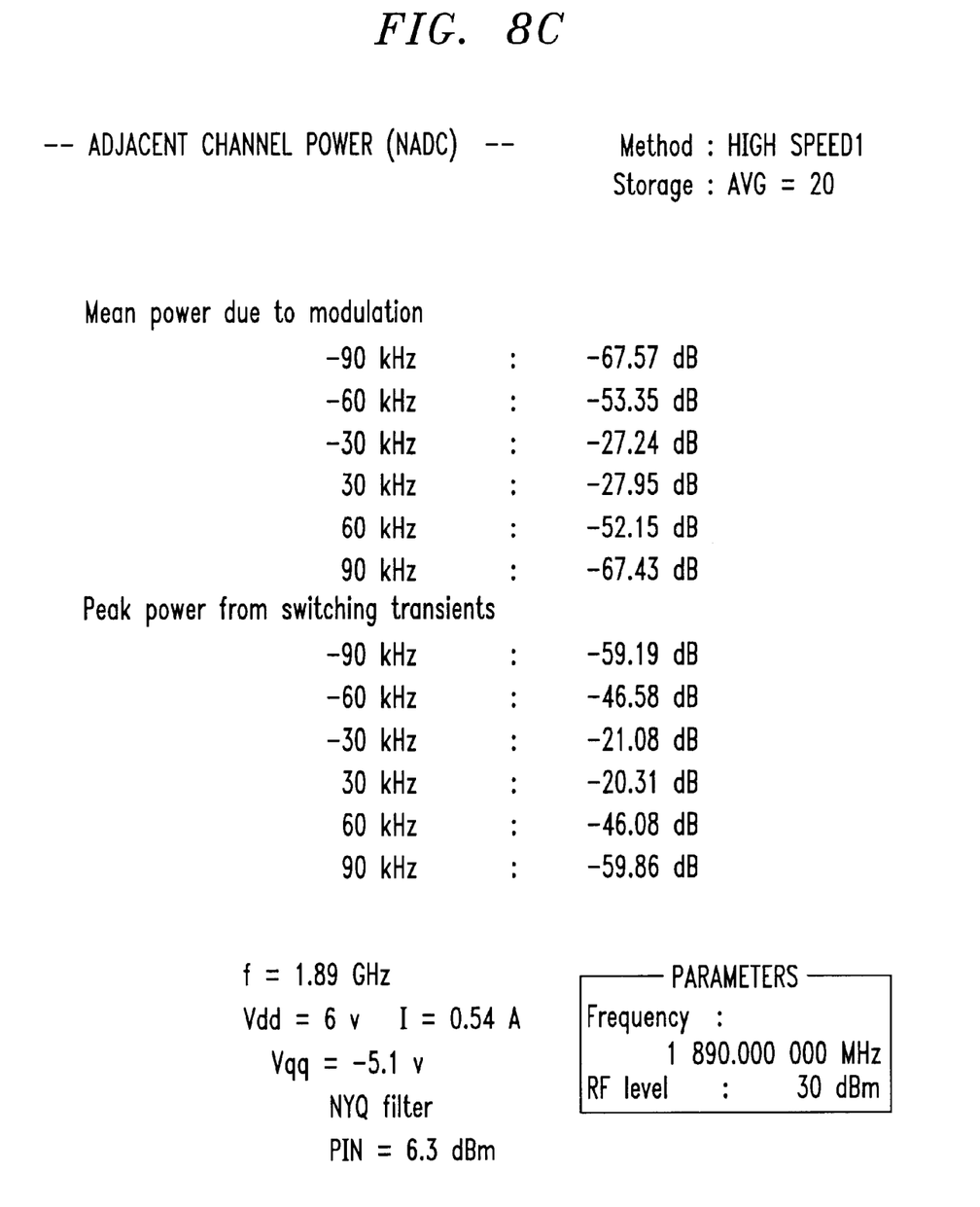

Since the measuring device did not have the capability to adjust parameters of an RRCF (as is the problem with most measuring devices), a Nyquist filter was used to produce FIGS. 8A to 8C. The Nyquist filter simulates in the disclosed embodiment an RRCF filter having the high transmit power filter parameters 104.

Of note in FIG. 8A is the transmit power of 29.49 dBm, which is substantially the same as that shown in FIG. 7A. Of note in FIG. 8B is the RMS vector error of 14.29% (rms), indicating that the vector error has increased (as expected due to the changed simulated RRCF filter parameters). However, this is not of much concern, particularly since as shown in FIG. 8C, adjacent channel power is adequately attenuated to greater than −26 dB. In particular, as shown in FIG. 8C, the mean power due to modulation at −30 kHz has improved substantially to −27.24 dB.

The determination of RRCF parameters was done using RF simulator software, OMNISYS commercially available from HP-EESOF. The simulated measurements were performed on the transmitter's configuration created for a generic phone model.

The experimental proof of this concept was done in a TDMA system on an ANRITSU test setup. While performed and proved specifically with embodiments relating to TDMA systems, the principles of the present invention relate equally to other multiple access communication systems, e.g., CDMA or FDMA as well.

Figure 6:
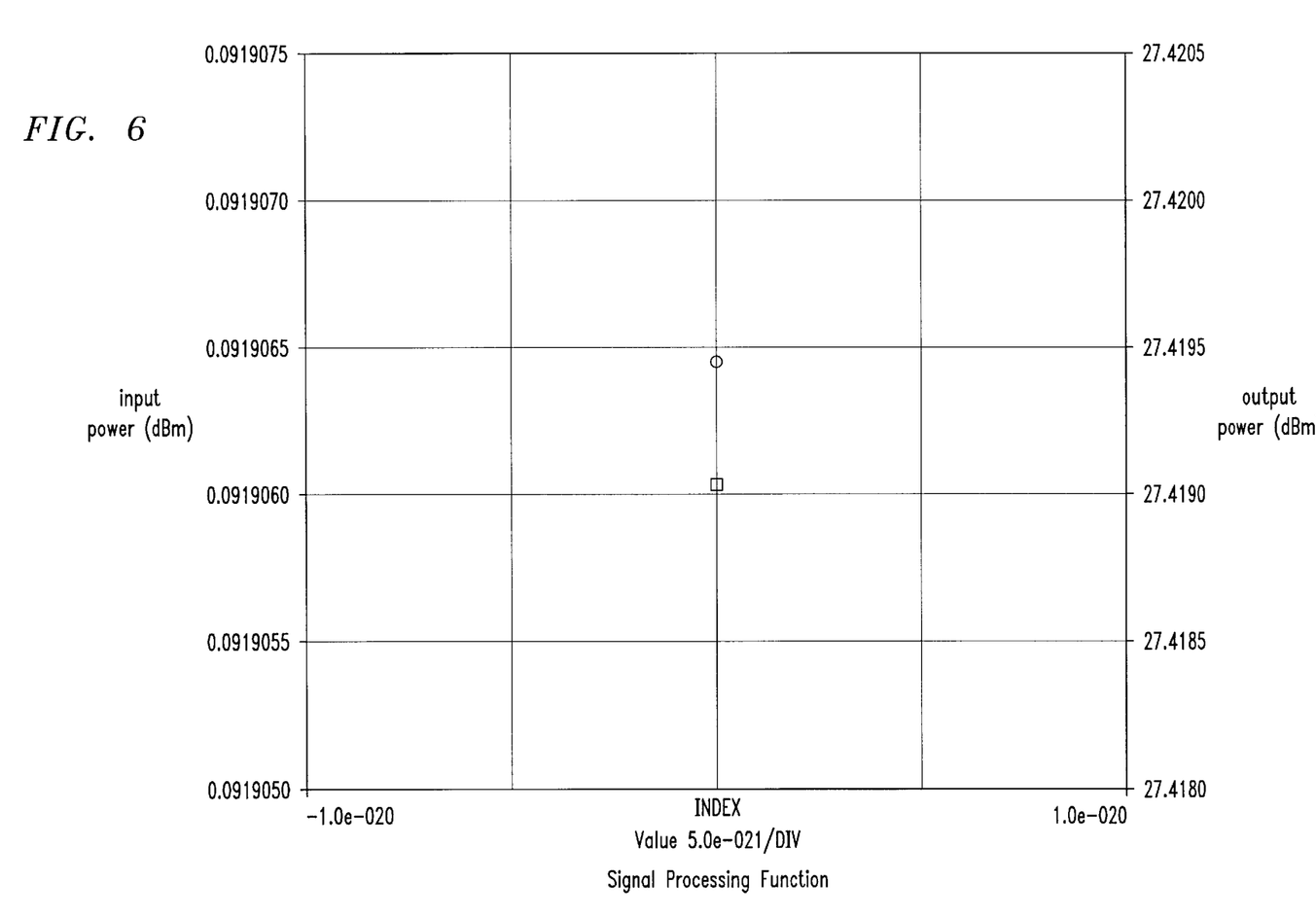
FIG. 6 shows the set of RF power levels at which the simulations of FIGS. 7A to 7C and 8A to 8C were conducted.

The modulated signal from the output of the generator MS3670B was fed into the amplifier. The output signal of that amplifier was measured by the TDMA power meter MS8604A. FIG. 6 shows the set of RF power levels at which the simulations of FIGS. 7A to 7C and 8A to 8C were conducted.

Initially, the amplifier was biased for the operation in a linear mode. In this mode the amplifier was delivering ~29 dBm of the output power with EVM of ~3.5% and ACP of ~29 dB. The DC current consumption was 0.71 A.

Then the amplifier was re-biased to operate in nonlinear mode. In order to obtain the same output power, the input power level was increased. At the linear case power level (~29 dB), the ACP was below 26 dB (minimum acceptable value), while EVM was ~6% (FIGS. 7A–7C). The DC current consumption was reduced to 0.55 A though.

Then the shaping of the input data stream was changed. The only way to change the shaping in ANRITSU setup was to change the filter's type. The shaping filter was changed from RRCF to NYQ (Nyquist) one. The input power was adjusted to obtain the same value of the output power as in previous cases (~29 dBm). At that power level, the value of ACP improved to be better than 27 dB. However the EVM value jumped to more than 14% (FIGS. 7A–7C). The DC current consumption though stayed the same as in the nonlinear case, that is 0.55 A.

The method of simulations basically coincided with the method of the experimental proof of concept. That is, at first the Power Amplifier was tuned to be in non-linear mode by changing the value of its compression point ($P_{1dB}$=28.5 dBm). Then, by increasing its input power, the output power level was adjusted to be the same as in a linear mode (~27.5 dBm). The value of ACP in that case was ~24 dB.

Then the bandwidth of RRCF was reduced by 5%. It improved the ACP value to ~27.5 dB while EVM value was still acceptable (~9%).

The method to return to the original RRCF parameters is straightforward. We introduce two sets of Root Raised Cosine Filter parameters. One set is a set of original parameters, and the other set is a set of modified parameters. When the phone is required to transmit at its maximum power level, the modified filter's parameters are downloaded. As soon as the phone is commanded to reduce its power level by more than 3 dB, original configuration parameters are again downloaded.

Other embodiments are possible using at least two look-up tables.

Since the switching is performed by downloading different filter coefficients, therefore, in practical terms, use of different parameters for the RRCF does not add appreciably to the total cost of the solution.

While the invention has been described with reference to the exemplary embodiments thereof, those skilled in the art will be able to make various modifications to the described embodiments of the invention without departing from the true spirit and scope of the invention.

What is claimed is:

1. A transmitter of a wireless device, comprising:
   a power amplifier;
   a root raised cosine filter;
   a first set of parameters for said root raised cosine filter to adapt said root raised cosine filter to provide a first level of linearization to a modulated signal amplified by said power amplifier; and a second set of parameters for said root raised cosine filter to adapt said root raised cosine filter to provide a second level of linearization to said modulated signal amplified by said power amplifier.

2. The transmitter of a wireless device according to claim 1, wherein:

said first set of parameters are a traditional set of parameters for said root raised cosine filter.

3. The transmitter of a wireless device according to claim 1, wherein:

said power amplifier is a non-linear power amplifier.

4. The transmitter of a wireless device according to claim 1, wherein:

said wireless device is a time division multiple access (TDMA) device.

5. The transmitter of a wireless device according to claim 4, wherein:

said TDMA device is a wireless telephone.

6. The transmitter of a wireless device according to claim 1, wherein:

said wireless device is a CDMA device.

7. The transmitter of a wireless device according to claim 1, wherein:

said wireless device is a frequency division multiple access (FDMA) device.

8. The transmitter of a wireless device according to claim 1, wherein:

said modulated signal passes through said power amplifier before passing through said root raised cosine filter.

9. The transmitter of a wireless device according to claim 1, wherein:

said modulated signal passes through said root raised cosine filter before passing through said power amplifier.

10. A method of improving efficiency of a power amplifier in a transmitter, comprising:

adaptively configuring a first set of parameters in a root raised cosine filter when a transmit power of said power amplifier is below a predetermined level; and adaptively configuring a second set of parameters in said root raised cosine filter when a transmit power of said power amplifier is above said predetermined level.

11. The method of improving efficiency of a power amplifier in a transmitter according to claim 10, wherein:

said first set of parameters reduce inter-symbol interference in a time division multiple access system.

12. The method of improving efficiency of a non-linear power amplifier according to claim 10, wherein:

said predetermined level is approximately a maximum operable transmit level.

13. The method of improving efficiency of a non-linear power amplifier according to claim 10, wherein:

said power amplifier is a non-linear amplifier.

14. Apparatus for improving efficiency of a power amplifier in a transmitter, comprising:

means for adaptively configuring a first set of parameters in a root raised cosine filter when a transmit power of said power amplifier is below a predetermined level; and means for adaptively configuring a second set of parameters in said root raised cosine filter when a transmit power of said power amplifier is above said predetermined level.

15. The apparatus for improving efficiency of a power amplifier in a transmitter according to claim 14, wherein:

said first set of parameters reduce inter-symbol interference in a time division multiple access system.

16. The apparatus for improving efficiency of a non-linear power amplifier according to claim 14, wherein:

said predetermined level is approximately a maximum operable transmit level.

17. The apparatus for improving efficiency of a non-linear power amplifier according to claim 14, wherein:

said power amplifier is a non-linear amplifier.

* * * * *